United States Patent
Shen (10) Patent No.: US 8,426,255 B2
(45) Date of Patent: Apr. 23, 2013

(54) CHIP PACKAGE STRUCTURE AND METHOD FOR MANUFACTURING THE SAME

(75) Inventor: Geng-Shin Shen, Tainan (TW)

(73) Assignee: Chipmos Technologies, Inc., Hsinchu (TW)

( * ) Notice: Subject to any disclaimer, the term of this patent is extended or adjusted under 35 U.S.C. 154(b) by 56 days.

(21) Appl. No.: 13/232,946

(22) Filed: Sep. 14, 2011

(65) Prior Publication Data

US 2013/0065361 A1    Mar. 14, 2013

(51) Int. Cl.
- *H01L 21/44* (2006.01)
- *H01L 21/48* (2006.01)
- *H01L 21/50* (2006.01)

(52) U.S. Cl.
USPC .... 438/123; 438/106; 438/613; 257/E21.006; 257/E21.253; 257/E21.267; 257/E21.293; 257/E21.502; 257/E21.503; 257/E21.508; 257/E21.499; 257/E21.511

(58) Field of Classification Search .................. 438/123, 438/122, 127, 106, 108, 611, 613; 257/E21.006, 257/E21.499, E21.502, E21.503, E21.508, 257/E21.511

See application file for complete search history.

(56) References Cited

U.S. PATENT DOCUMENTS

| | | | |
|---|---|---|---|
| 6,084,310 A * | 7/2000 | Mizuno et al. | 257/779 |
| 6,423,623 B1 * | 7/2002 | Bencuya et al. | 438/612 |
| 8,183,607 B2 * | 5/2012 | Kajiwara et al. | 257/288 |
| 2005/0218494 A1 * | 10/2005 | Satou et al. | 257/678 |

* cited by examiner

*Primary Examiner* — David Nhu
(74) *Attorney, Agent, or Firm* — Chun-Ming Shih (57) ABSTRACT

A method for manufacturing a semiconductor package structure is disclosed. In one embodiment, the method includes the steps of forming a plurality of conductive pastes on a matrix lead frame with a groove located within a predetermined distance from each conductive paste on the lead; partially curing the conductive pastes so that the conductive pastes are in a semi-cured state; preparing at least one chip with a plurality of bumps thereon; electrically connecting the chip and the lead by implanting the bumps into the semi-cured conductive pastes, wherein the groove on the lead of the matrix lead frame is configured to receive overflowed semi-cured conductive pastes; curing the semi-cured conductive pastes to completely secure the bumped chip; and forming an encapsulating material covering the lead frame and the chip. The method can also be applied in pre-molded lead frame package.

21 Claims, 13 Drawing Sheets

CHIP PACKAGE STRUCTURE AND METHOD FOR MANUFACTURING THE SAME

FIELD OF THE INVENTION

The present invention is related to semiconductor device packaging, and more particularly to a lead structure configured to control overflowed materials during the semiconductor device packaging process.

BACKGROUND OF THE INVENTION

With the remarkable advances in semiconductor technologies, the electronics industry has been through a very rapid revolution from thick to thin films, and further to ever increasing miniaturization. Semiconductor packaging, which is the science of establishing interconnections with the semiconductor devices to form circuits, has been developed concurrently with the rapid advances in the semiconductor and electronics industries.

Semiconductor packaging usually includes a lead frame that is a structure providing electrical interconnections to one or more semiconductor devices, such as an integrated circuits (IC) die. Typically, the die attached to the lead frame is electrically connected to the leads of the lead frame with wires through a wire bonding process, and an encapsulating material can be used to cover and seal the lead frame, wires, and IC die therein to complete the packaging process. The main purpose of packaging is to ensure that the semiconductor devices and interconnections are packaged efficiently and reliably.

Recently, flip chip mounting has become a popular technique for directly and electrically connecting an integrated circuit chip to a substrate. More specifically, during the manufacturing process, solder bumps are deposited on the top side of the chip surface and the chip is flipped over to align the electrical bond pads on the chip with corresponding electrical bond pads on the substrate. The flip chip and the substrate are then heated to cause the solder to melt and wet the electrical bond pads of the substrate to complete the interconnection. The substrate and flip chip are then cooled to solidify the solder thereby forming the desired electrical connections. Conventionally, once the flip chip is bonded to the substrate, an underfill material, which is typically provided as a liquid adhesive resin that can be dried or polymerized, is dispensed between the chip and the substrate. The underfill material provides enhanced mechanical adhesion and mechanical and thermal stability between the flip chip and the substrate, and prevent the chip and substrate surfaces from environmental interferences.

Figure 1A:
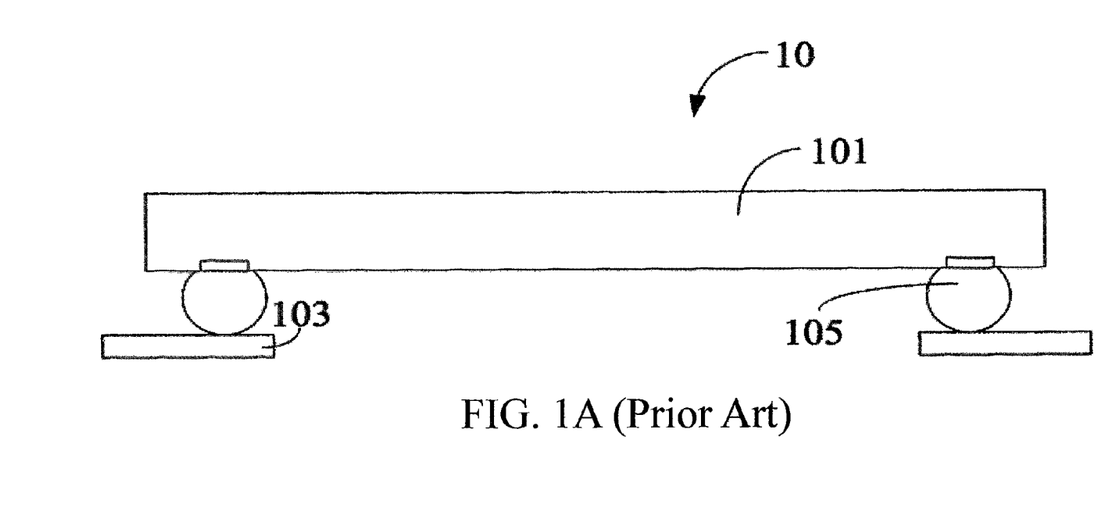
FIG. 1 illustrates a conventional flip chip structure that may cause failure in the packaging process due to overflowed materials.

A sectional view of a conventional flip chip structure 10 can be seen on FIG. 1A, which includes a chip 101 with an active face facing down, a plurality of bumps 105 that is used to electrically connect to leads 103 of a lead frame (not shown). When the chip 101 is slightly pressed down and heated for being further secured on the leads 103, the bump 105 may be deformed since it has not been completely solidified. Moreover, the bump 105 may spread (see 107 in FIG. 1B) to a bottom surface of the lead 103 which may create unnecessary interconnection between the chip 101 and the bottom surface of the lead 103, and further lead to a failure in packaging. This problem may also occur when the bump of the flip chip is implanted into a conductive paste on the lead 103 since the conductive paste may as well spread to cause failure in packaging. Therefore, there remain a need for a new and improved lead frame structure that can be used for receiving and confining overflowed materials to avoid failure in the packaging process.

SUMMARY OF THE INVENTION

It is an object of the present invention to provide a flip chip semiconductor packaging method that can significantly avoid failure during the packaging process and further improve the efficiency and reliability of the packaged device.

It is another object of the present invention to provide a method for manufacturing a flip chip package structure having better control of overflowed materials that can be confined in a recessed structure located on the leads of a lead frame.

It is a further object of the present invention to provide a flip chip semiconductor packaging method that can be applied in a manufacturing process of pre-molded lead frame packages.

In one aspect of the present invention, a method for manufacturing a semiconductor package structure may include steps of forming a plurality of conductive thermosetting pastes on leads of a matrix lead frame with a groove located within a predetermined distance from each conductive thermosetting paste on the lead of the matrix lead frame; partially curing the conductive thermosetting pastes so that the conductive pastes are in a semi-cured, tacky and semi-solid state; preparing at least one chip with a plurality of bumps thereon; electrically connecting the chip and the lead of the matrix lead frame by implanting the bumps into the semi-cured conductive pastes, wherein the groove on the lead of the matrix lead frame is configured to receive and confine overflowed semi-cured conductive pastes; curing the semi-cured conductive pastes to completely secure the bumped chip; and preparing an encapsulating material to cover the lead frame and the chip.

In one embodiment, the step of preparing at least one chip with a plurality of bumps thereon comprises a step of forming gold bumps, copper pillars, gold stud bumps, copper stud bumps, or gold/copper metal composite bumps. In another embodiment, the step of preparing an encapsulating material covering the lead frame and the chip thereon may include the step of utilizing injection molding, overmolding or underfill potting. In a further embodiment, the Tg (glass transition temperature) of the conductive thermosetting paste is −40 to 175° C.

In another aspect of the present invention, a semiconductor package may include a matrix lead frame having a plurality of inner leads and outer leads, and a groove located at each inner lead; a semiconductor chip having a plurality of bumps for electrically connecting the chip and the inner lead of the lead frame; a plurality of semi-cured conductive thermosetting pastes to mount the chip on the lead frame; and an encapsulating material used to seal and cover the chip and lead frame, wherein the conductive thermosetting paste is located within a predetermined distance from an edge of the inner lead, and the groove is located within a predetermined distance from the conductive thermosetting paste, and when the bump of the chip is implanted into the conductive thermosetting paste, the groove is configured to receive and confine overflowed conductive thermosetting pastes in the groove, and the semi-cured conductive thermosetting paste is fully cured to completely secured the chip.

In one embodiment, the bumps may include gold bumps, copper pillars, gold stud bumps, copper stud bumps, or gold/copper metal composite bumps. In another embodiment, the matrix lead frame can be a pre-molded lead frame. In a further embodiment, the groove can be made by conventional photolithography and etching processes.

In a further aspect of the present invention, a method for manufacturing a pre-molded lead frame package may include steps of: forming a semi-cured encapsulant between a plurality of leads of a matrix lead frame and a top surface of a supporting carrier; forming a pre-molded lead frame by curing the semi-cured encapsulant; bonding at least one chip with a plurality of bumps on the leads of the matrix lead frame, each chip being electrically connected to a part of the leads of the matrix lead frame through a plurality of bumps; forming a groove on each lead, said groove configured to receive and confine overflowed bumps to avoid spreading; encapsulating the chips and the matrix lead frame; and forming a package by singulating the encapsulated chips and the encapsulated matrix lead frame, wherein the package comprises one of the encapsulated chips and a part of the encapsulated matrix lead frame.

In one embodiment, the pre-molded lead frame package can be a Quad Flat Non-leaded (QFN) package. In another embodiment, the semi-cured encapsulant is not higher than a top surface of the leads of the matrix lead frame. In still another embodiment, each lead has an inner lead portion and an outer lead portion, and a bottom surface of the inner lead portion is higher than a bottom surface of the outer lead portion. In a further embodiment, the bumps may directly connect to the leads of the matrix lead frame by thermo-ultrasonic bonding.

The present invention together with the above and other advantages may best be understood from the following detailed description of the embodiments of the invention illustrated in the drawings below.

DETAILED DESCRIPTION OF THE INVENTION

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

All publications mentioned are incorporated by reference for the purpose of describing and disclosing, for example, the designs and methodologies that are described in the publications that might be used in connection with the presently described invention. The publications listed or discussed above, below and throughout the text are provided solely for their disclosure prior to the filing date of the present application. Nothing herein is to be construed as an admission that the inventors are not entitled to antedate such disclosure by virtue of prior invention.

As stated above, flip chip mounting has become a popular technique for directly and electrically connecting an integrated circuit chip to a substrate. However, in conventional flip chip mounting process, the bump or conductive thermosetting pastes used to secure the bump may spread to the bottom surface of the leads of a lead frame (see FIGS. 1A and 1B), which may cause failure in the packaging process. The present invention provides a new and improved lead frame structure that can receive and confine overflowed materials to avoid failure in the packaging process and further improve the efficiency and reliability of the packaged device. Moreover, the lead frame structure can be a pre-molded lead frame.

Figure 1B:
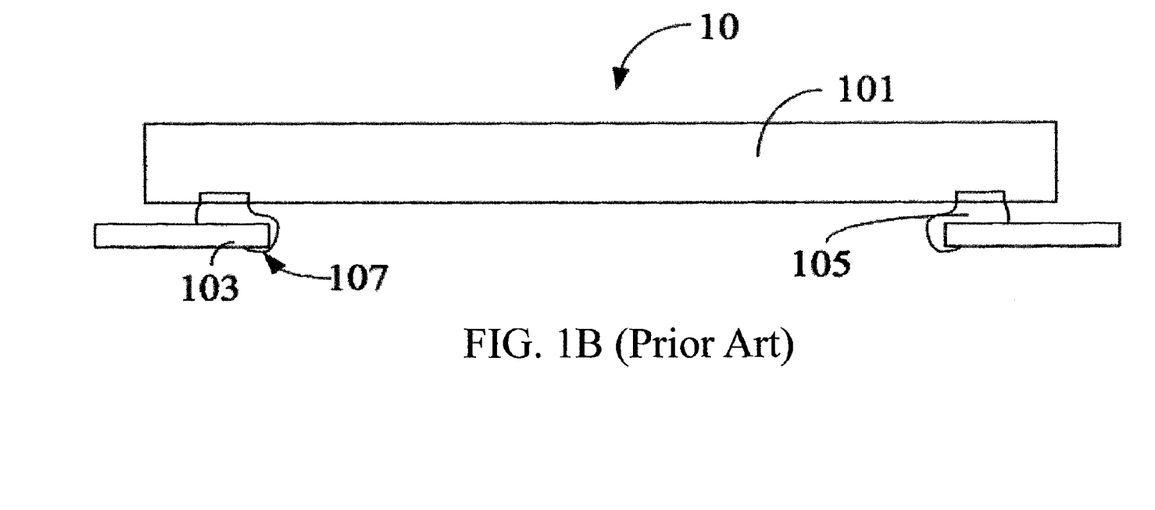
Figure 2A:
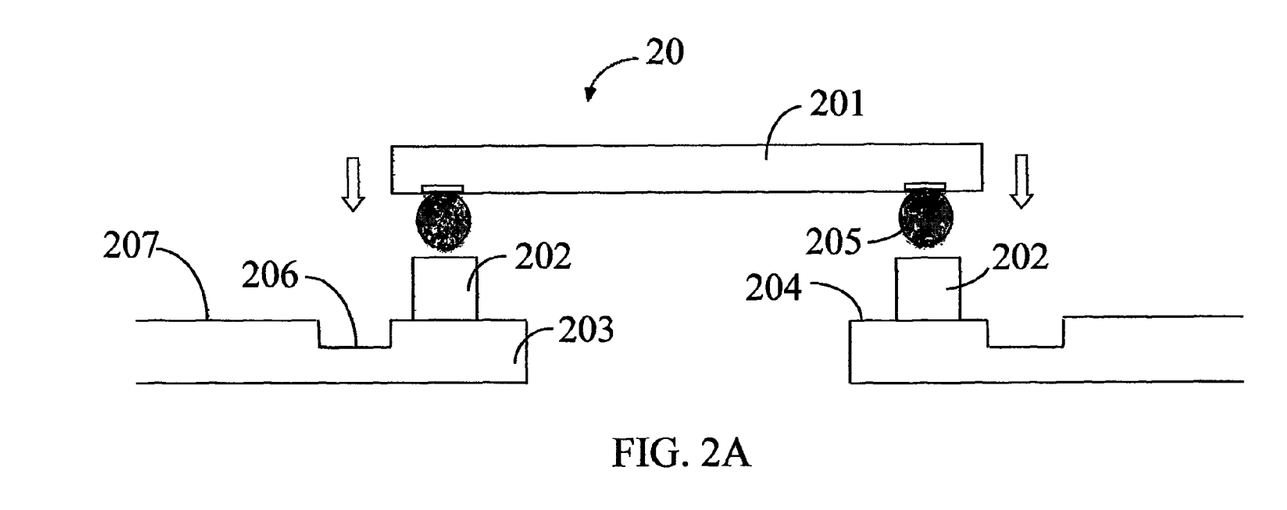
FIGS. 2A and 2B illustrate one embodiment of the present invention when a chip with a number of bumps are implanted into conductive semi-cured pastes on the leads, and a groove on the lead is configured to receive and confine overflowed conductive pastes.
Figure 2B:
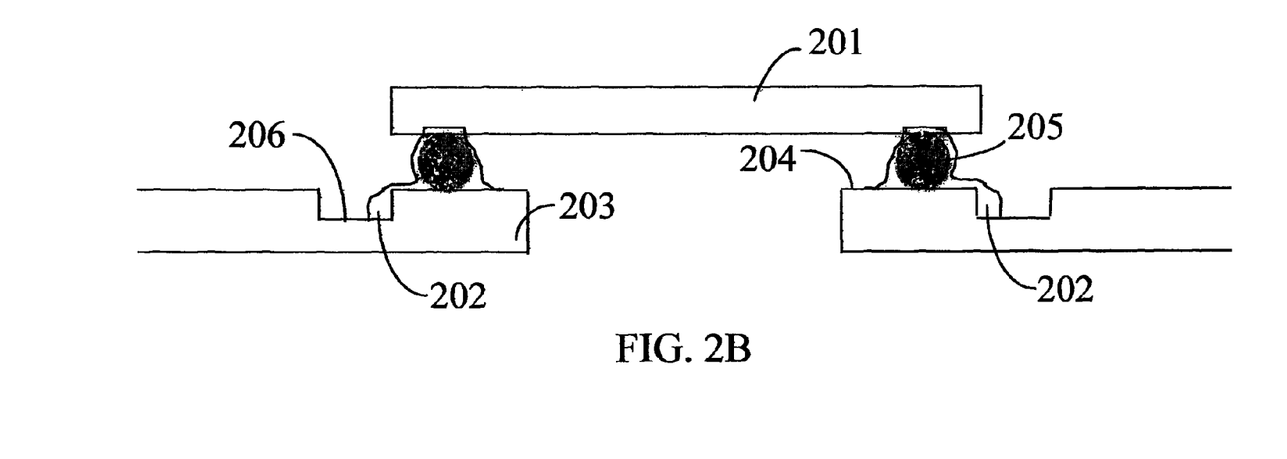
Figure 2C:
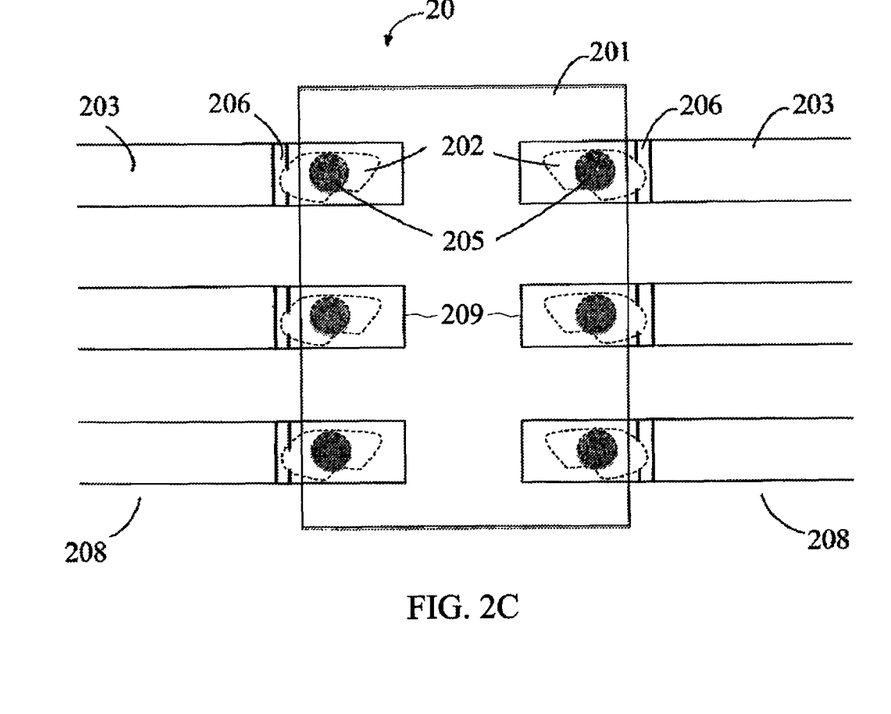
FIG. 2C illustrates a top view of the embodiment shown in FIGS. 2A and 2B.

In one embodiment according to FIGS. 2A to 2C, a flip chip structure 20 in the present invention may include a chip 201, a plurality of leads 203 of a lead frame matrix 208, a semi-cured conductive thermosetting paste 202 located on a top surface 207 of each lead 203, a plurality of bumps 205 on an active surface of the chip 201 and a groove 206. When the chip 201 is pressed down to connect with the leads 203 of the lead frame matrix 208, the bumps 205 are implanted into the conductive thermosetting paste 202. Since the conductive thermosetting paste 202 is semi-cured, it can be compressed and deformed, and the deformed conductive thermosetting paste 202 may be slightly flowable. Unlike conventional flip chip structure shown in FIGS. 1A and 1B, the conductive thermosetting pastes 202 that flow away from their original positions may be collected and confined in the groove 206 in the present invention, so even the semi-cured conductive thermosetting paste 202 is slightly flowable, it can be confined in the groove 206 without randomly spreading to other portions of the lead 203. It is noted that the conductive thermosetting paste 202 may also spread toward other directions, including an edge 204 and two sidewalls 209, of the lead 203. In this embodiment, the conductive thermosetting paste is located with a predetermined location on the lead 203 to avoid spreading over the edge 204 and sidewalls 209. The Tg (glass transition temperature) of the conductive thermosetting paste 202 in the present invention is −40 to 175° C., and the conductive thermosetting paste 202 can be subsequently cured to completely secure the bumps 205 and the chip 201. An encapsulating material (not shown) may be used to cover the lead frame matrix and chip, which will be illustrated and discussed in the following embodiments.

FIG. 2C illustrates a top view of the flip chip structure 20 in the present invention, where a plurality of bumps 205 of the chip 201 are implanted into a plurality of conductive thermosetting pastes 202 located on the leads 203 of the lead frame matrix 208, and some of the semi-cured conductive thermosetting pastes 202 are compressed and deformed to flow into the groove 206. It is noted that a wide variety of electrically conducting compositions can be used for making the interconnection between flip chip and the substrate, such as gold bumps, copper pillars, gold stud bumps, copper stud bumps, and gold/copper metal composite bumps.

Figure 3:
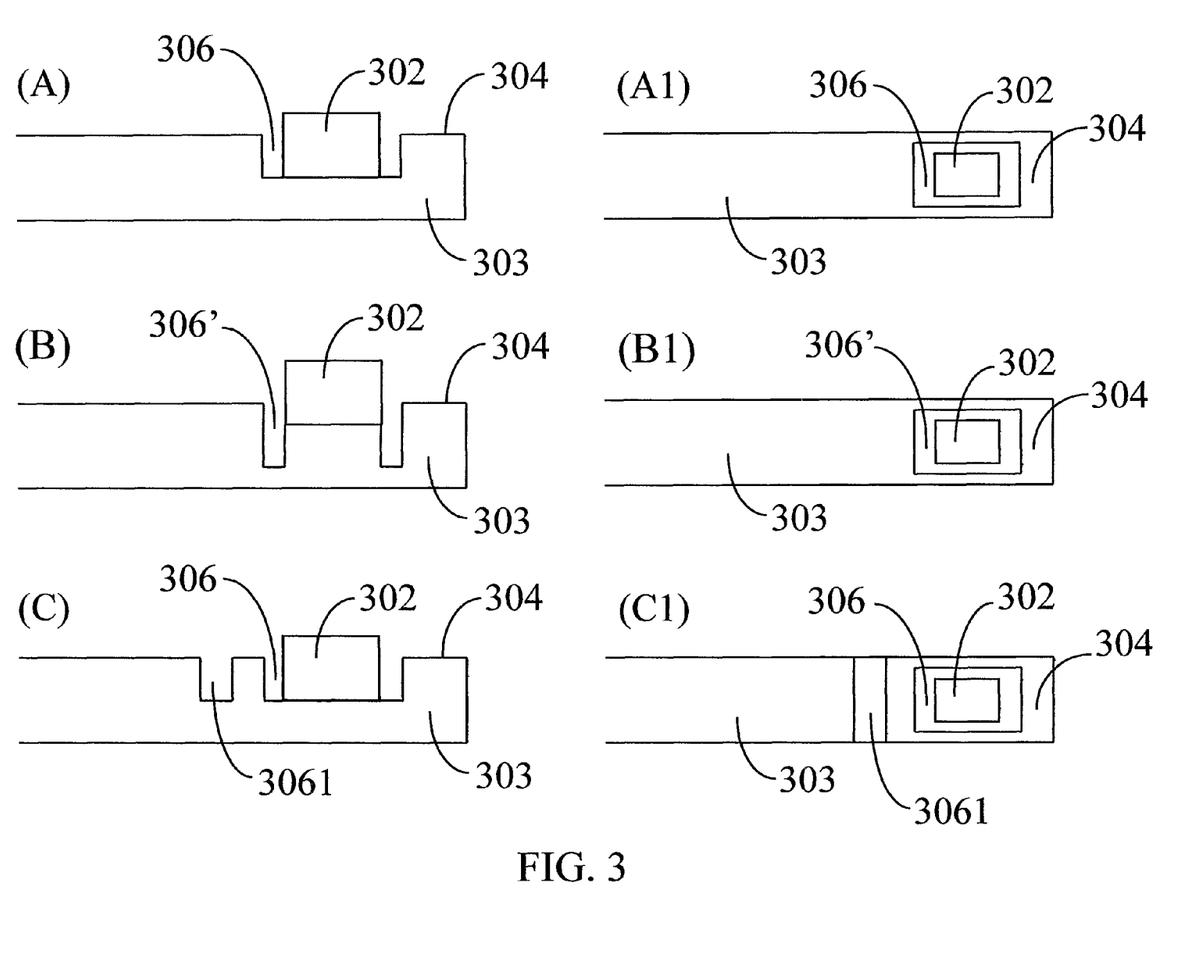
FIGS. 3A to 3C illustrate a schematic sectional view of various groove configurations in the present invention.

In another embodiment as shown in FIG. 3A, instead of being located "close" to the groove as mentioned above, a semi-cured conductive thermosetting paste 302 is actually located "inside" a groove 306 located at a lead 303 including an edge 304. Namely, the conductive thermosetting paste 302 is surrounded by the groove 306 that is configured to confine most, if not all, overflowed conductive thermosetting paste 302, as can be seen in FIG. 3A1. So, when the bumps are implanted into the conductive thermosetting paste 302, the conductive thermosetting paste 302 can be deformed to slightly flow as shown in FIG. 2B, however, it is unlikely for the conductive thermosetting paste 302 to flow outside the groove 306 to contaminate the lead 303 or further cause the failure of the packaging process. In a similar embodiment shown in FIGS. 3B and 3B1, a groove 306' is even deeper than the groove 306 to prevent overflow of the conductive thermosetting paste 302. In a further embodiment shown in FIGS. 3C and 3C1, a second groove 3061 is provided to receive and confine the overflowed conductive thermosetting paste 302, if any, to further ensure that there is no overflowed conductive thermosetting paste 302 to damage the packaging process. It is noted that the embodiments discussed above are not limited to receive and confine overflowed conductive thermosetting pastes. Any materials that may spread on the leads (e.g. bumps, see FIGS. 1A and 1B) can be received and confined. Likewise, the conductive thermosetting paste 302 can be subsequently cured to completely secure the bumps, and an encapsulating material may be used to cover the lead frame matrix and chip.

Figure 4A:
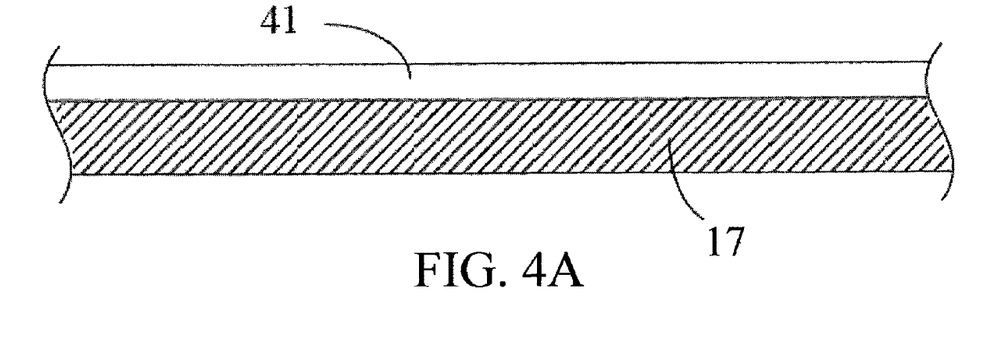
FIGS. 4A to 4F depict a lamination process to form a pre-molded lead frame structure in the present invention.

Lead frame package has played an increasingly important role in semiconductor packaging industry due to its small size, cost-effectiveness, good production yields and lightweight. QFN package is also known for its faster signal transmission speed and better heat dissipation. In one embodiment, the lead structure with a groove thereon to confine overflowed materials in the present invention can also be applied in QFN package, as well as pre-molded QFN package. As can be seen in FIG. 4A, an encapsulant 17 can be formed at a bottom surface of a tape 41 by dipping, screen-printing, painting, spin-coating or spraying. The encapsulant 17 can be made from thermosetting materials having two-stage property, including but not limited to polyimide, polyquinolin, benzocyclobutene, or the like. It is noted that the thermosetting material used here is semi-cured, namely in semi-liquid or gel state, so that it can be easily spread on the bottom surface of the tape 41. Also, the thermosetting material with two-stage property is non-conductive.

Figure 4B:
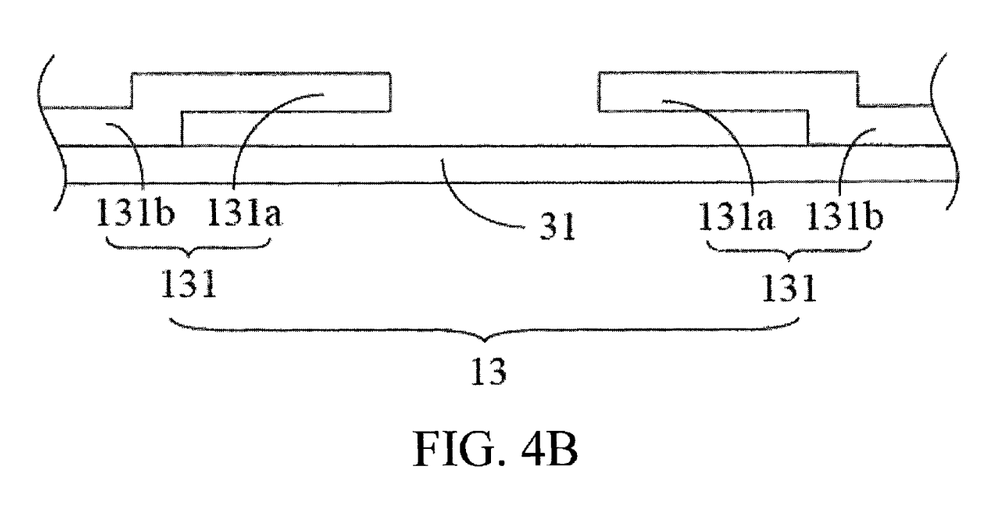

Referring to FIG. 4B, a matrix of lead frame 13 may include a supporting carrier 31 and a plurality of leads 131 that are located on a top surface of the supporting carrier 31. Each lead has an inner lead 131a and an outer lead 131b, and a bottom surface of the inner lead is higher than a bottom surface of the outer lead. Typically, the inner lead 131a is used for subsequent electrical interconnection to an integrated circuit device while the outer lead 131b is for subsequent interconnection to external circuitry.

Figure 4C:
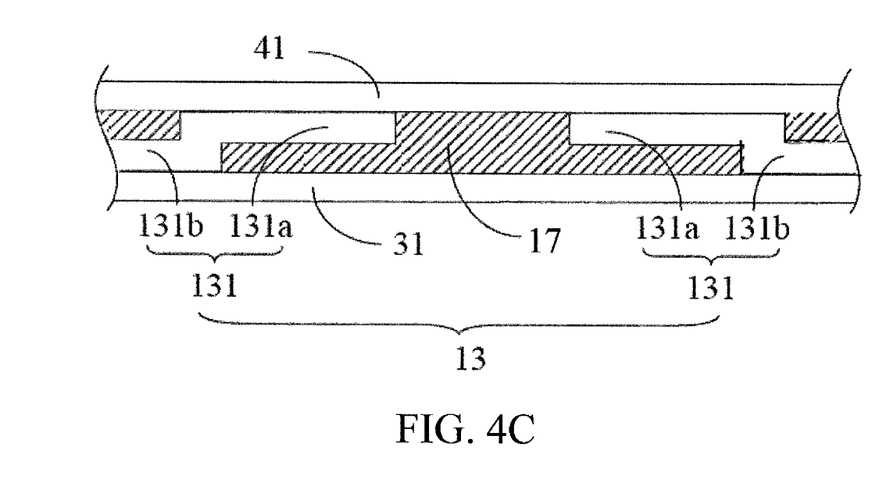
Figure 4D:
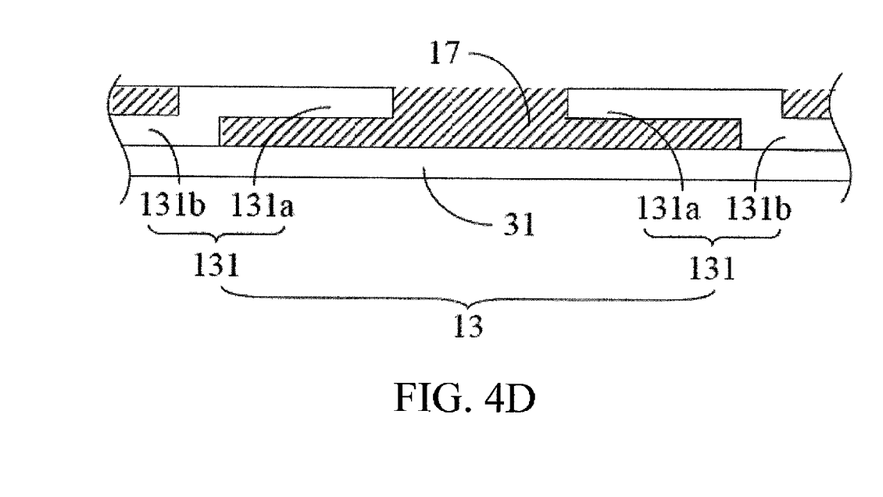
Figure 4E:
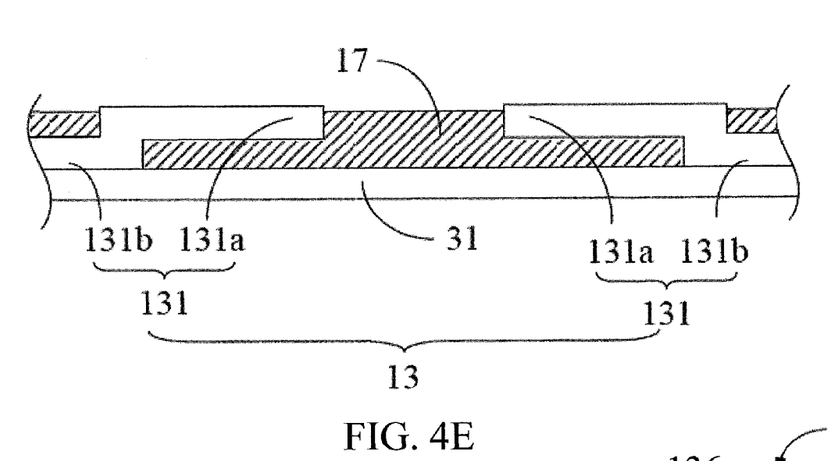

FIG. 4C illustrates a lamination process to combine the structures shown in FIGS. 4A and 4B, where the leads 131 on the lead frame 13 are completely covered by the tape 41 coated with the encapsulant 17. More specifically, the tape 41 is disposed on a top surface of the lead 131 and the semi-cured encaplulant 17 spreads into the lead frame 13, including the space between the top surface of the supporting carrier 31 and the bottom surface of the inner lead 131a. The tape can then be removed as can be seen in FIG. 4D, and a pre-molded lead frame is formed after the semi-cured encapsulant 17 is cured. It is noted that the semi-cured encapsulant 17 may not be higher than a top surface of the leads 131 after curing as shown in FIG. 4E.

Figure 4F:
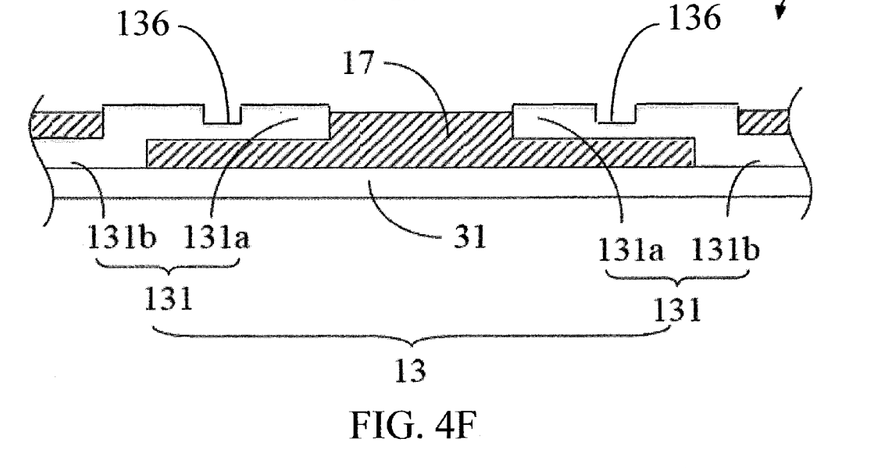

As can be seen in FIG. 4F, the pre-molded structure 42 may also include a groove 136 that is configured to receive and confine overflowed materials on the lead 131. As detailed above, the groove 136 may have various configurations (see FIGS. 2A to 2B, 3A to 3C) to ensure that there is no overflowed material to cause failure during the packaging process. The groove 136 can be formed by conventional photolithography along with etching process used in the semiconductor industry.

Figure 5A:
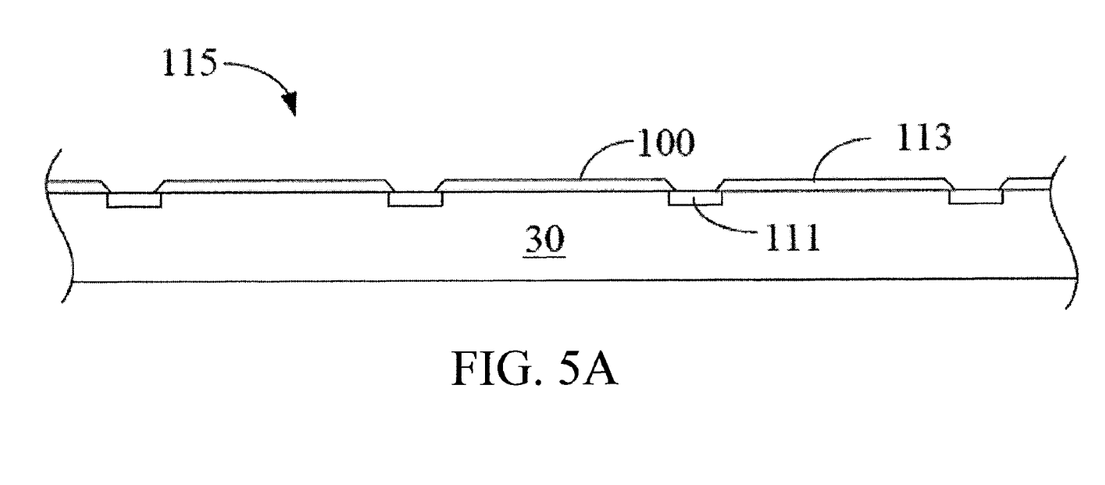
FIGS. 5A to 5C illustrate a schematic sectional view of a chip device which may be used in the flip chip mounting process in the present invention.
Figure 5B:
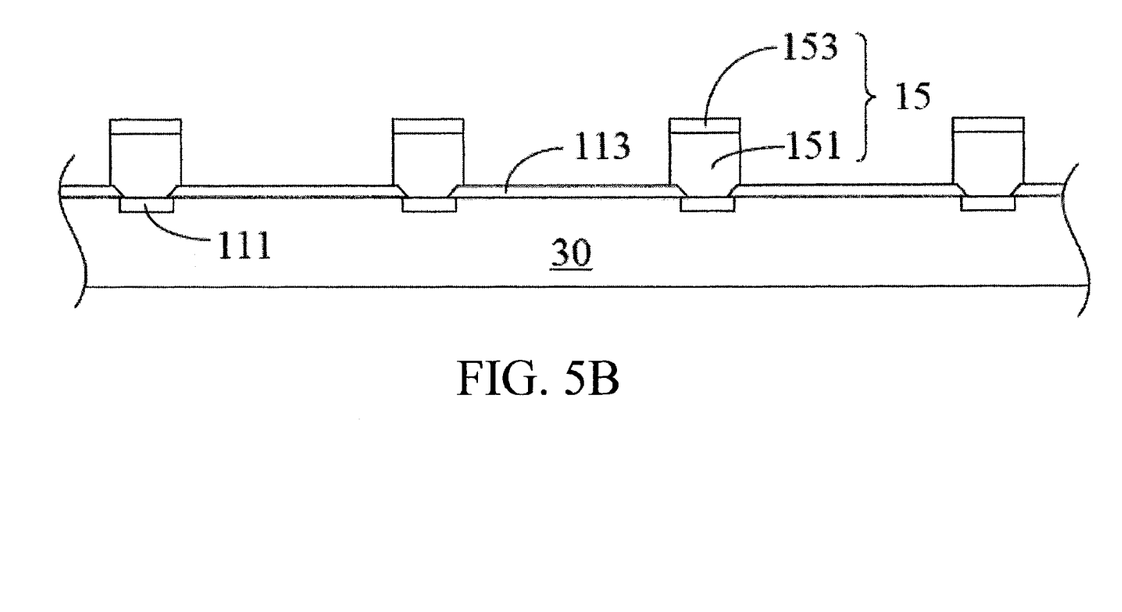

Referring to FIG. 5A, a chip device 115 may include a substrate 30, a plurality of pads 111, an active surface 100 and an insulation layer 113. In one embodiment, the substrate is a silicon substrate and the insulation layer 113 is made of silicon nitride ($Si_3N_4$), which is often used as the insulation layer in silicon-based devices. As can be seen in FIG. 5B, a plurality of bumps 15 are formed on top of the pads 111. The bump 15 can also be made of two different materials 151 and 153. As mentioned above, a wide variety of electrically conducting compositions can be used for as bumps, such as gold bumps, copper pillars, gold stud bumps, copper stud bumps, and gold/copper metal composite bumps. Furthermore, a plurality of singulated chip devices 11 are formed through a singulation process as shown in FIG. 5C.

Figure 5C:
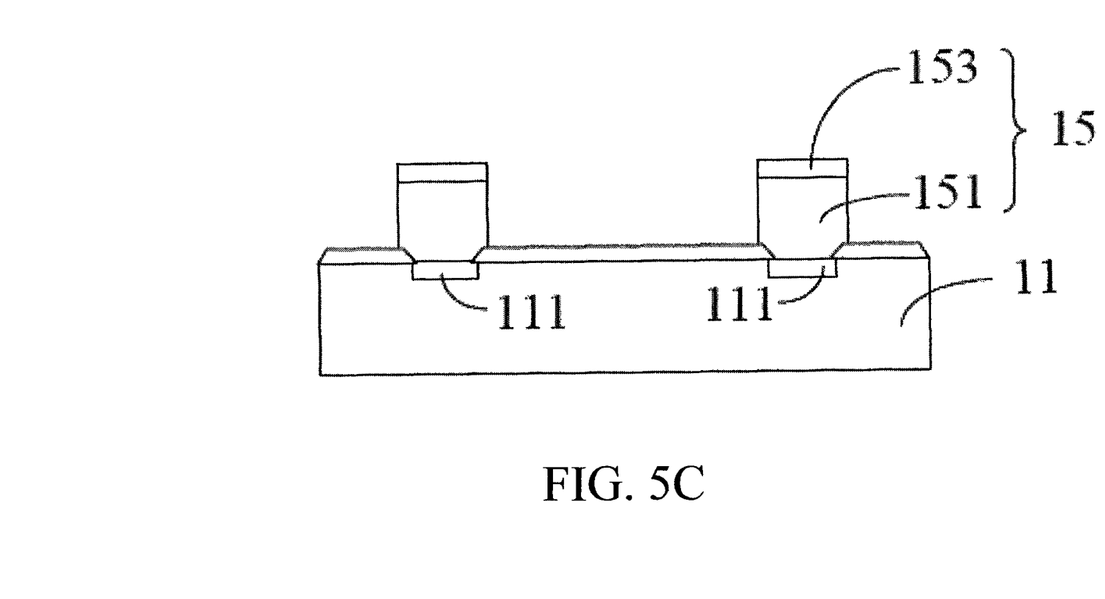
Figure 6A:
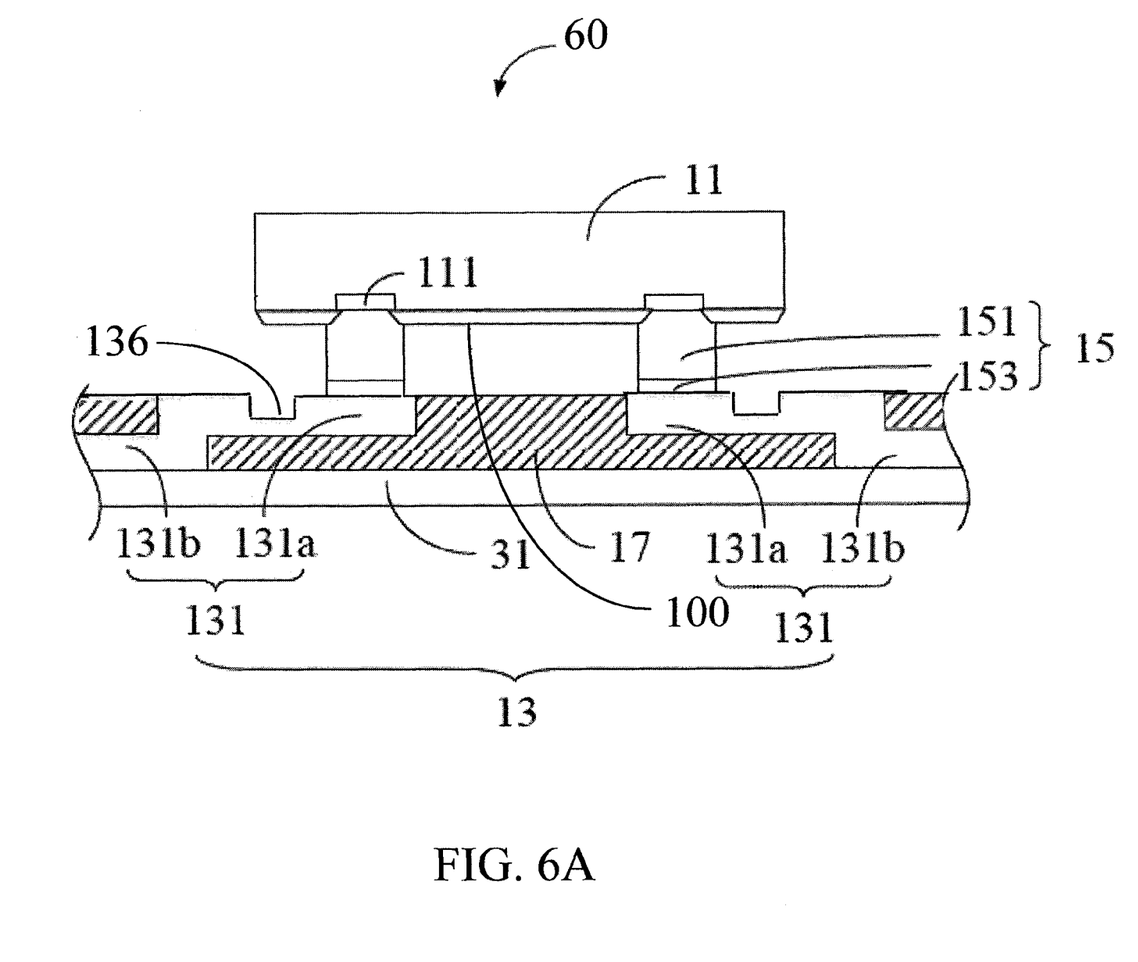
FIG. 6A illustrates the chip in FIG. 5C mounting on the pre-molded lead frame structure shown in FIG. 4F in the present invention.

In an exemplary embodiment shown in FIG. 6A, a flip chip structure 60 may include the sigulated chip device 11 (as shown in FIG. 5C) mounting on the pre-molded structure (as shown in FIG. 4F). More specifically, the chip device 11 is flipped with the active surface 100 facing down, and the bumps 15 are mounted on a top surface of the inner lead 131a to electronically connect the chip device 11 and the pre-molded structure. The bumps 15 may include two different materials 151 and 153, and the bumps 15 can be directly mounted to the inner leads 131a by thermo-ultrasonic bonding. The bumps 15 can also be mounted to the inner leads 131a by using the conductive thermosetting pastes as previously discussed.

The grooves 136 on the inner leads 131a, as illustrated above, are configured to receive and confine overflowed bump materials in the present embodiment, so that the overflowed bump materials are unlikely to spread as shown in FIGS. 1A and 1B, which may further cause failure in the packaging process. It is noted that the groove 136 may have various configurations (see FIGS. 2A to 2B, 3A to 3C) that can all be applied in the present embodiment to serve the same purposes.

Figure 6B:
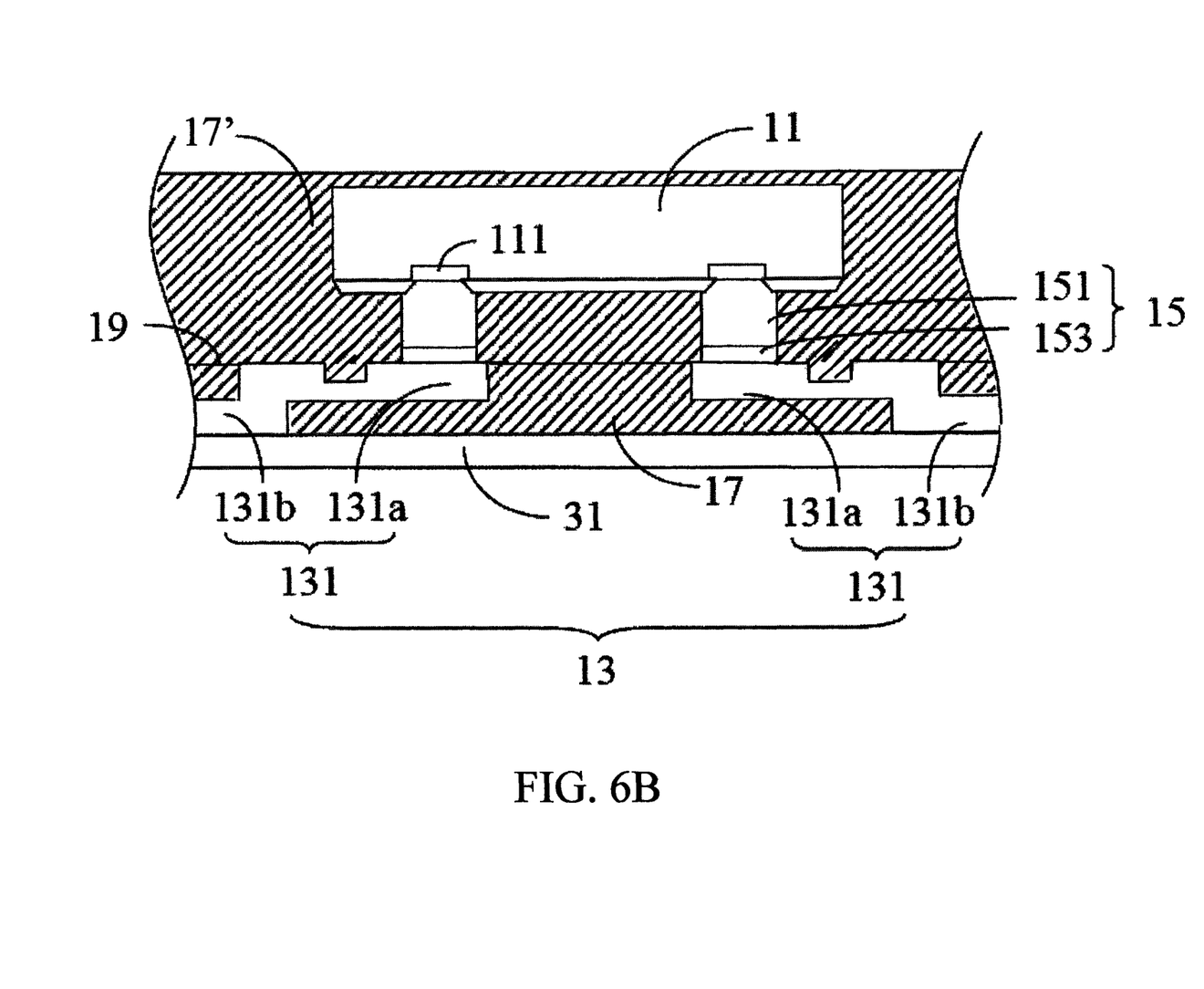
FIG. 6B illustrates a pre-molded QFN structure after encapsulating the structure shown in FIG. 6A.

As shown in FIG. 6B, a second encapsulating material 17' can then be applied to cover the chip device 11, the lead frame 13 (including the inner lead 131a and part of the outer lead 131b), and the bumps 15 to complete the packaging process, and a pre-molded QFN package with an improved lead structure is formed. In one embodiment, the encapsulation surface 19 here may not higher than a top surface of the lead frame 13. It is noted that the encapsulating material 17 and the second encapsulating material 17' can be identical. The encapsulating material can be applied to cover the lead frame 13 and the chip 11 by the means of injection molding, overmolding or underfill potting.

Figure 7:
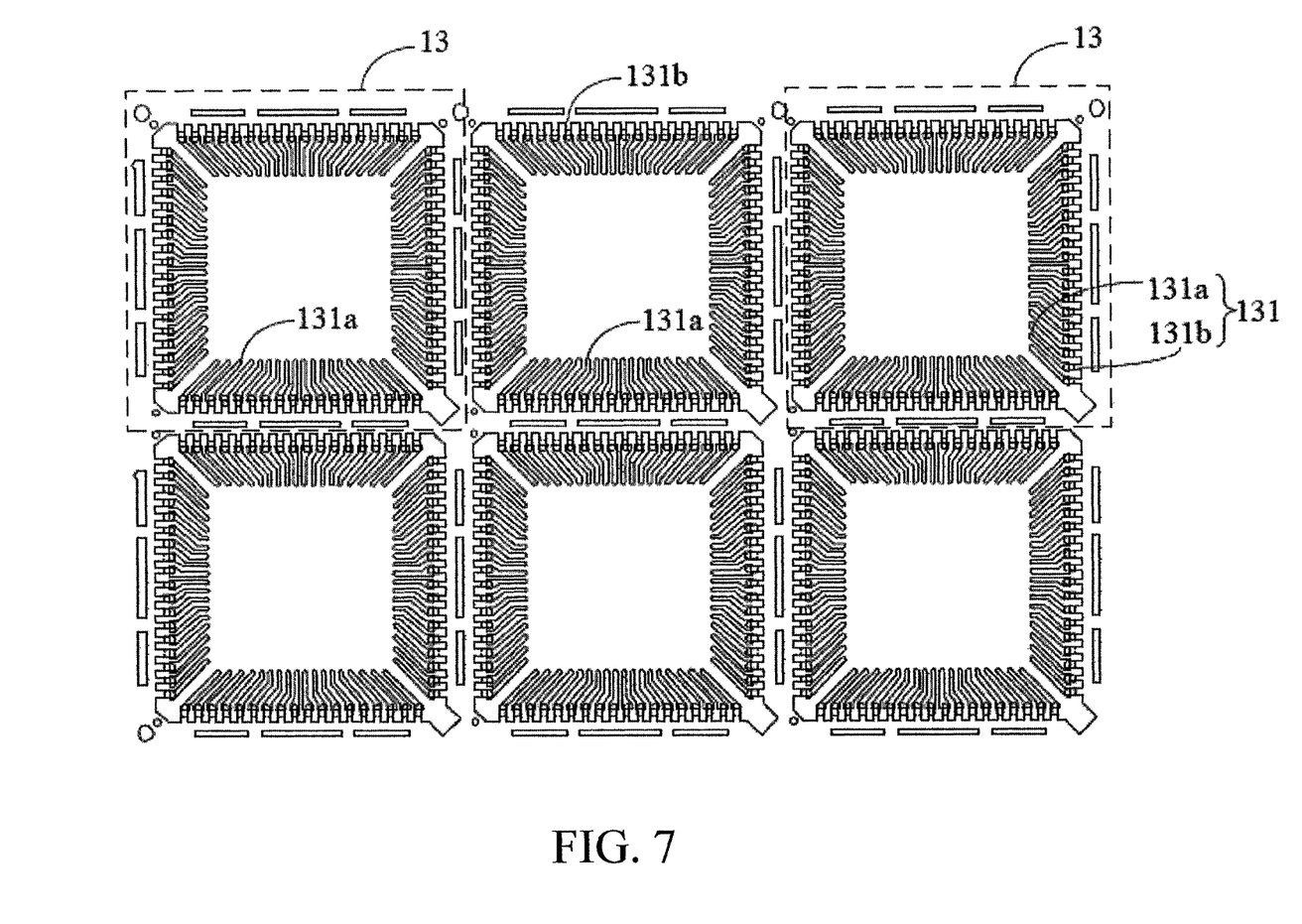
FIG. 7 illustrates a top view of the lead frame matrix in the present invention.

FIG. 7 illustrates a top view of a plurality of lead frame matrix 13 with a plurality of leads 131 including the inner lead 131a and outer lead 131b. The groove used in the present invention can be formed on the inner lead 131a to confine overflowed materials to avoid failure during the packaging process. The groove can be formed by conventional photolithography and etching process in the semiconductor industry.

Figure 8:
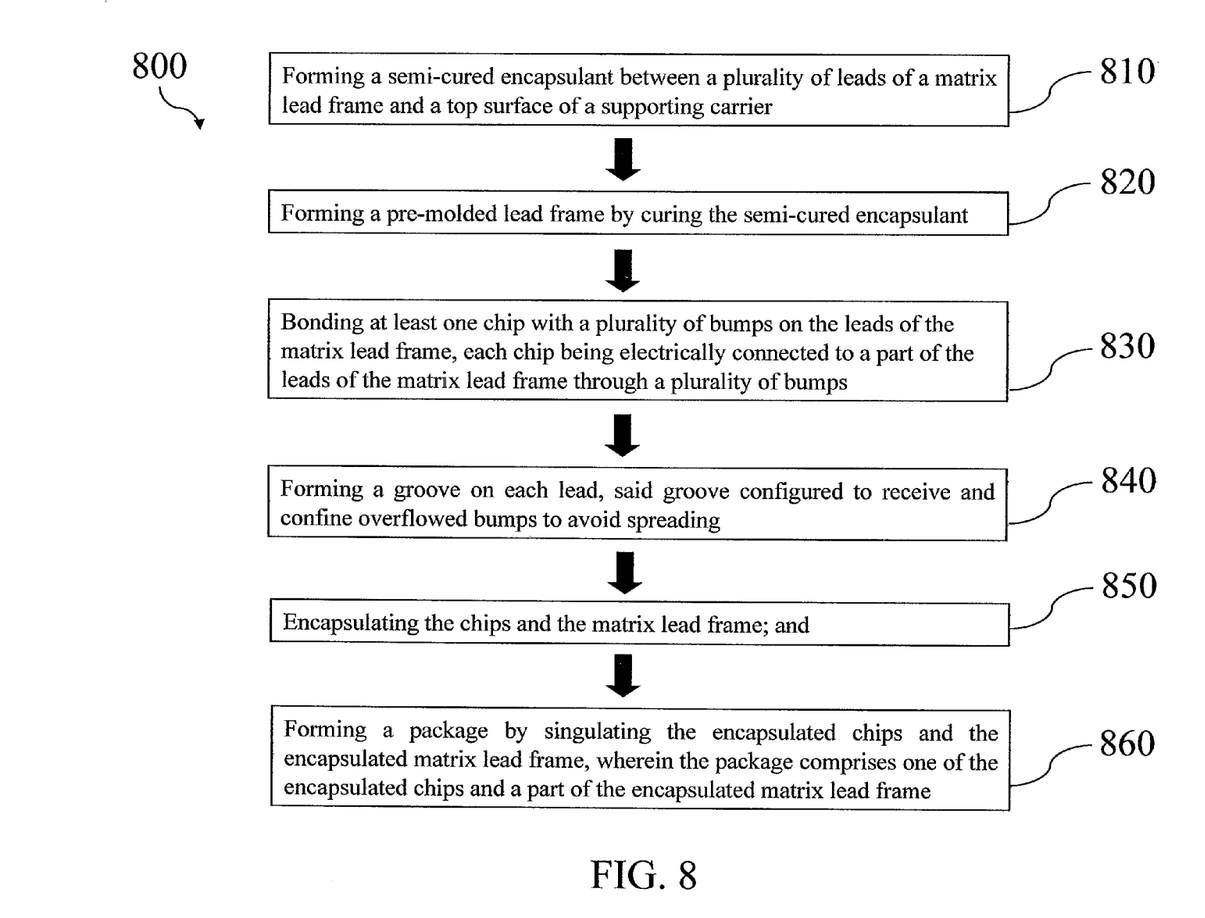
FIG. 8 is another aspect of the present invention, illustrating a method of manufacturing a pre-molded lead frame package.

In another aspect of the present invention, FIG. 8 illustrating a method for manufacturing a pre-molded lead frame package (800) may comprise steps of: forming a semi-cured encapsulant between a plurality of leads of a matrix lead frame and a top surface of a supporting carrier 810; forming a pre-molded lead frame by curing the semi-cured encapsulant 820; bonding at least one chip with a plurality of bumps on the leads of the matrix lead frame, each chip being electrically connected to a part of the leads of the matrix lead frame through a plurality of bumps 830; forming a groove on each lead, said groove configured to receive and confine overflowed bumps to avoid spreading 840; encapsulating the chips and the matrix lead frame 850; and forming a package by singulating the encapsulated chips and the encapsulated matrix lead frame, wherein the package comprises one of the encapsulated chips and a part of the encapsulated matrix lead frame 860.

In one embodiment, wherein the step of forming a semi-cured encapsulant between a plurality of leads of a matrix lead frame and a supporting carrier 810 comprises steps of: coating a semi-cured encapsulant on a bottom surface of a tape, disposing the tape onto a top surface of the leads of the matrix lead frame during a lamination process, and removing the tape. As can be seen in FIGS. 4C and 4D, the tape 41 is coated with the encapsulant 17 and disposed on top of the leads of the matrix lead frame 13, and the tape 41 is removed after the lamination process. The encapsulant can be coated on the tape 41 by dipping, screen-printing, painting, spin-coating or spraying. In another embodiment, the step of forming a groove on each lead 840 comprises a step of forming a groove surrounding the bump, as shown in FIGS. 3A and 3B. In a further embodiment, the pre-molded lead frame package is a Quad Flat Non-leaded (QFN) package. Having described the invention by the description and illustrations above, it should be understood that these are exemplary of the invention and are not to be considered as limiting. Accordingly, the invention is not to be considered as limited by the foregoing description, but includes any equivalent.

What is claimed is:

1. A method for manufacturing a semiconductor package structure, comprising steps of:
   forming a plurality of conductive pastes on a matrix lead frame, wherein a groove is located within a predetermined distance from each conductive paste on the lead of the matrix lead frame;
   partially curing the conductive pastes so that the conductive pastes are in a semi-cured, tacky and semi-solid state;
   preparing at least one chip with a plurality of bumps thereon;
   electrically connecting the chip and the lead of the matrix lead frame by implanting the plurality of bumps into the semi-cured conductive pastes, wherein the groove on the lead of the matrix lead frame is configured to receive and confine overflowed semi-cured conductive pastes;
   curing the semi-cured conductive pastes to completely secure the bumped chip; and
   forming an encapsulating material to cover the lead frame and the chip.

2. The method for manufacturing a semiconductor package structure of claim 1, wherein preparing at least one chip with a plurality of bumps thereon comprises forming gold bumps, copper pillars, gold stud bumps, copper stud bumps, or gold/copper metal composite bumps.

3. The method for manufacturing a semiconductor package structure of claim 1, further comprising curing the encapsulating material.

4. The method for manufacturing a semiconductor package structure of claim 3, further comprising singulating the matrix lead frame.

5. The method for manufacturing a semiconductor package structure of claim 1, wherein the matrix lead frame is a pre-molded matrix lead frame.

6. The method for manufacturing a semiconductor package structure of claim 1, wherein forming an encapsulating material covering the lead frame and the chip thereon is selected from the means of injection molding, overmolding or underfill potting.

7. The method for manufacturing a semiconductor package structure of claim 1, wherein forming a groove located within a predetermined distance from each conductive paste on the lead of the matrix lead frame, comprises forming a surrounding groove around the conductive paste.

8. A semiconductor package comprising:
   a matrix lead frame having a plurality of inner leads and outer leads, and a groove located at each inner lead;
   a semiconductor chip having a plurality of bumps for electrically connecting the semiconductor chip and the inner lead of the matrix lead frame;
   a plurality of semi-cured conductive pastes used to mount the semiconductor chip on the inner lead of the matrix lead frame; and
   an encapsulating material used to seal and cover the semiconductor chip and the matrix lead frame,
   wherein the groove is located within a predetermined distance from the conductive paste, and when the plurality of bumps of the semiconductor chip are implanted into the semi-cured conductive paste, the groove is configured to receive and confine overflowed conductive pastes in the groove, and the semi-cured conductive paste is fully cured to completely secured the semiconductor chip on the matrix lead frame.

9. The semiconductor package of claim 8, wherein the bumps include gold bumps, copper pillars, gold stud bumps, copper stud bumps, or gold/copper metal composite bumps.

10. The semiconductor package of claim 8, wherein the encapsulating material is further cured and the matrix lead frame is singulated.

11. The semiconductor package of claim 8, wherein the matrix lead frame is a pre-molded lead frame.

12. The semiconductor package of claim 11, wherein the pre-molded lead frame comprises a supporting carrier, a plurality of leads including inner leads and outer leads located on the supporting carrier, and a second encapsulating material that is semi-cured, wherein the second encapsulating material is coated on a tape that is subsequently disposed on a top surface of the inner leads to spread and cover the lead frame.

13. The semiconductor package of claim 12, wherein the tape is subsequently removed and the second encapsulating material is cured.

14. The semiconductor package of claim 8, wherein the groove is configured to surround the conductive paste to avoid overflowed conductive pastes.

15. A method for manufacturing a pre-molded lead frame package comprising steps of:
- forming a semi-cured encapsulant between a plurality of leads of a matrix lead frame and a top surface of a supporting carrier;
- forming a pre-molded lead frame by curing the semi-cured encapsulant;
- bonding at least one chip with a plurality of bumps on the plurality of leads of the matrix lead frame, each chip being electrically connected to a part of the plurality of leads of the matrix lead frame through the plurality of bumps;
- forming a groove on each lead, said groove configured to receive and confine overflowed bumps to avoid bump spreading;
- encapsulating the chips and the matrix lead frame; and
- forming a package by singulating the encapsulated chips and the encapsulated matrix lead frame, wherein the pre-molded lead frame package comprises one of the encapsulated chips and a part of the encapsulated matrix lead frame.

16. The method for manufacturing a pre-molded lead frame package of claim 15, wherein forming a semi-cured encapsulant between a plurality of leads of a matrix lead frame and a top surface of a supporting carrier comprises coating a semi-cured encapsulant on a bottom surface of a tape, disposing the tape onto a top surface of the leads of the matrix lead frame during a lamination process, and removing the tape.

17. The method for manufacturing a pre-molded lead frame package of claim 16, wherein coating a semi-cured encapsulant on a bottom surface of a tape comprises dipping, screen-printing, painting, spin-coating or spraying a semi-cured encapsulant on a bottom surface of a tape.

18. The method for manufacturing a pre-molded lead frame package of claim 15, wherein forming a groove on each lead comprises forming a groove surrounding the plurality of bump.

19. The method for manufacturing a pre-molded lead frame package of claim 15, wherein forming an encapsulating material covering the lead frame and the chip thereon is selected from the means of injection molding, overmolding or underfill potting.

20. The method for manufacturing a pre-molded lead frame package of claim 15, wherein bonding at least one chip with a plurality of bumps on the leads of the matrix lead frame includes directly connecting the bumps to the leads of the matrix lead frame by thermo-ultrasonic bonding.

21. The method of manufacturing a pre-molded lead frame package of claim 15, wherein the pre-molded lead frame packages is a Quad Flat Non-leaded (QFN) package.

* * * * *